United States Patent [19]
Thompson

[11] Patent Number: 5,444,728
[45] Date of Patent: Aug. 22, 1995

[54] LASER DRIVER CIRCUIT

[75] Inventor: Marc T. Thompson, Watertown, Mass.

[73] Assignee: Polaroid Corporation, Cambridge, Mass.

[21] Appl. No.: 172,834

[22] Filed: Dec. 23, 1993

[51] Int. Cl.⁶ .............................................. H01S 3/00
[52] U.S. Cl. .................................... 372/38; 372/29; 372/26
[58] Field of Search .................... 372/38, 29, 25, 26

[56] References Cited

U.S. PATENT DOCUMENTS

| | | | |
|---|---|---|---|
| 4,081,670 | 3/1978 | Albanese | 250/199 |
| 4,237,427 | 12/1980 | Holland | 331/94.5 S |
| 4,347,610 | 8/1982 | Meuleman | 372/29 |
| 4,412,331 | 10/1983 | Chapman | 372/29 |
| 4,492,970 | 1/1985 | Lee et al. | 346/160 |
| 4,504,951 | 3/1985 | McMahan et al. | 372/38 |
| 4,539,686 | 9/1985 | Bosch et al. | 372/26 |
| 4,677,632 | 6/1987 | Lisco et al. | 372/38 |
| 4,698,817 | 10/1987 | Burley | 372/31 |
| 4,709,370 | 11/1987 | Bednarz et al. | 372/38 |
| 4,713,672 | 12/1987 | Horihata et al. | 346/108 |
| 4,725,854 | 2/1988 | Ohtsuka et al. | 346/108 |
| 4,748,633 | 5/1988 | Negishi | 372/38 |
| 4,771,431 | 9/1988 | Nakazawa et al. | 372/38 |
| 4,791,632 | 12/1988 | Anderson et al. | 372/31 |
| 4,878,066 | 10/1989 | Shiraishi | 346/108 |
| 4,886,963 | 12/1989 | Ohmori | 250/235 |
| 4,912,714 | 3/1990 | Hatanaka et al. | 372/31 |
| 4,916,706 | 4/1990 | Ohashi | 372/31 |
| 4,945,541 | 7/1990 | Nakayama | 372/31 |
| 5,123,023 | 6/1992 | Santarelli et al. | 372/38 |
| 5,170,403 | 12/1992 | Mayer | 372/26 |
| 5,177,755 | 1/1993 | Johnson | 372/38 |
| 5,182,756 | 1/1993 | Waki et al. | 372/38 |
| 5,191,589 | 3/1993 | Amano et al. | 372/38 |
| 5,199,038 | 3/1993 | Vahala et al. | 372/33 |
| 5,224,112 | 6/1993 | Uesaka | 372/38 |
| 5,253,267 | 10/1993 | Johnson | 372/38 |

OTHER PUBLICATIONS

An Integrated Circuit for Multiplexing and Driving Injection Lasers, R. G. Swartz et al., Journal of Solid State Circuits, vol. SC-17, No. 4, Aug. 1982, pp. 753–760.

Direct Modulation of Double–Hetero–Structure Lasers at Rates up to 1 Gbit/s, M. Chown et al., Electronics Letters, Jan. 25, 1973, vol. 9, No. 2.

Primary Examiner—Léon Scott, Jr.
Attorney, Agent, or Firm—Francis J. Caufield

[57] ABSTRACT

A driver circuit applies electric current to a semiconductor laser for emission of light suitable for use in a laser printer wherein a photosensitive medium is exposed by the light for imprinting an image of marks or pixels upon the medium. The current is the sum of bias current plus signal current, the latter being a sequence of pulses providing image data. The circuit includes a bypass around the laser, and the signal current is pulsed by using a switching circuit which applies a steady input current alternately to the laser and the bypass under control of a digital data signal. The switching circuit is an array of emitter-coupled logic elements operating in parallel for reduced inductance and higher switching speed. The steady input current is provided by a switching current regulator wherein a power transistor, driven by a pulse width modulator, alternately connects and disconnects current from a DC power supply in conjunction with a smoothing filter comprising an inductor and a capacitor. A current sensing resistor connects in series with the parallel circuit of laser and bypass to output a sense signal representing the amplitude of the steady input current. The sensor signal drives the pulse width modulator via a loop compensation element to establish an average value of laser current. An additional ripple current source, responsive to a high frequency component of the sensor signal, is added to the input current to counteract any ripple from the regulator.

20 Claims, 5 Drawing Sheets

LASER DRIVER CIRCUIT

BACKGROUND OF THE INVENTION

This invention relates to a laser driver circuit, suitable for use in a laser printing system and, more particularly, to the implementation of a pulse modulation of the laser current by diverting laser current around the laser in a bypass during interpulse intervals, the invention including also features of parallel bypass switching stages of emitter-coupled logic (ECL) for reduced inductance and increased bandwidth, as well as use of a pulse-width modulated current-switching regulator to produce the main current for energizing the laser in conjunction with a feedback anti-ripple current source for cancellation of current ripple associated with operation of the current-switching regulator.

The use of a laser, in the form of a diode, has found wide use as a source of light in laser printing systems wherein pulses of the light illuminate a photosensistive material of a recording medium. By scanning the light across the medium, and by imparting imaging data to a train of pulses of the light, an image is constructed on the medium. By way of example, the image may be a message composed of alphanumeric characters, or the image may be in a pictorial format constructed of gray scale.

In the construction of a gray-scale image, pixels of dark and light image are imprinted with a sufficiently high density to appear to the human eye as a continuum wherein a high density of dark marks gives the appearance of a relatively dark region of the image while a low density of dark marks gives the appearance of a relatively light portion of the image. By way of example, such an imaging process is most useful for imprinting medical data, such as copies of x-rays, sonograms, and pictorial data from magnetic resonance imaging.

Protection of a high density of pixels on the recording medium is useful, not only in the production of high quality medical images, but also in the production of the printing of high quality alphanumeric characters, particularly in the case of very fine writing. In order to accomplish the small pixels, it is necessary to focus the laser beam to a small point on the medium, which point is to be illuminated by the laser beam, or is to be left blank by a termination of the laser beam. As a practical matter in the construction of such images, it is important to print the images quickly. This requires a rapid scanning of the laser beam relative to the medium, and a capacity for generating the pulses of light at a high rate, the latter requiring a high frequency operating capability to the electric circuitry which energizes the laser with pulses of current. In addition, in order to expose a pixel of the recording medium with sufficient optical energy to produce a mark in a short interval of time, there is a need for increased optical power output from a laser as well as increased power from the circuitry which drives the laser.

A problem arises in that presently available circuitry does not have both adequate power and adequate speed for rapid generation of high intensity pulses of laser light as would be desired for high resolution in the imaging of pictorial data. Attempts to overcome the problem of increased power with present circuit topologies generally entails utilization of larger heat sinks for dissipation of heat produced by the higher power circuits. However, such a requirement for enlarged heat sinks is incompatible with the relatively small spaces available in modern laser printers for replacement of electrical components as well as for the cooling of the components. As an example of the difficulties entailed in use of present laser circuit topologies, a linear feedback amplifier with a power transistor in the feedback loop has been used generally in the construction of circuits for driving pulses of current through a laser to excite the laser to emit light. However, an increase in the size of the power transistor for increased power handling capacity results in a reduction of the switching speed of the transistor. Furthermore, the enlarged power transistor is wasteful of energy due to the large amount of heat dissipated at the transistor, the heat in itself creating a need for additional heat sinking.

SUMMARY OF THE INVENTION

The aforementioned problem is overcome and other advantages are provided by a driver circuit for applying pulses of current to a semiconductor laser to energize the laser to emit pulses of light. As used herein, the term light is understood to include radiation in the visible spectrum as well as radiation lying outside of the visible spectrum such as infrared radiation and ultraviolet radiation. The invention is ideally suited for the driving of a laser in a printing system wherein light of the laser is scanned relative to a photosensitive recording medium, and wherein the pulses of light correspond to pulses of a digital data signal, each pulse providing data of a pixel of an image being printed on the medium.

In order to accommodate a higher input data rate and higher laser drive current, the drive circuit of the invention includes a bypass for conducting electric current in a path around the laser, in conjunction with a bypass switch which is operative to select an electrical path for the current to flow either through the laser or through the bypass. By directing the flow of current, to be referred to as the main current, through the laser, the laser is energized to emit light. In the alternate position of the bypass switch, the main current is directed to flow via the bypass so as to terminate emission of light by the laser. Thereby, by operation of the bypass switch in synchronism with the pulses of an input digital data signal, the laser emits a train of light pulses identical in format to the train of electrical pulses of the input digital signal. A bias current is provided by a bias current source directly to the laser for maintaining a minimum laser current having a value just below the lasing threshold of the laser. The main current is provided by a separate main current source connected with an input terminal of the bypass switch. An advantage in the use of the bypass switch for energizing and deenergizing the laser is the fact that the main current is able to flow continuously at a steady value even though the laser is being pulsed. The bypass switch simply redirects the flow of current through alternate current paths, namely the laser or the bypass. Preferably, the bypass path includes a resistor having a resistance approximately equal to the resistance of the laser so as to minimize the power dissipated in the current switch. The two current paths rejoin at a current sensing device, such as a current-sensing resistor. A voltage drop across the current sensing resistor serves as a current sense signal indicating the magnitude of the total laser current which is the sum of the main current plus the bias current.

The main current source is in the nature of a power converter which is connected to an external electrical power supply, such as a battery, and which includes a transistor connected as a gate or switch. The transistor is operated in pulsating fashion to alternately connect and disconnect a path of the main current flow from the external power source to the bypass switch. Included with the transistor switch are energy storage elements, particularly a capacitor connected to an input terminal of the transistor switch and an inductor connected to an output terminal of the transistor switch, for storing electrical energy of the pulses and for outputting the electrical energy as a steady value of the main current. The main current source further comprises a pulse-width modulator connected to a control terminal of the transistor switch for alternately placing the transistor switch in states of conduction and nonconduction with a duty cycle which is variable in accordance with the amount of the main current to be supplied. The modulator increases the conduction time of the transistor switch for an increased value of main current, and decreases the conduction time of the transistor switch to decrease the value of the main current. This enables the main current source to provide the peak values of current to the laser at a desired fixed amplitude for a uniform printing of an image on a recording medium. A feedback amplifier with a loop compensation filter connects between the current sensor signal and an input terminal of the pulse-width modulator to provide for closed-loop operation of the main current source in maintaining a desired amplitude of the main current.

It is noted that the switching operation of the main current source provides a ripple component in addition to the DC component of the main current. For improved uniformity in the illumination of the recording medium by the laser light, it may be desirable to reduce the tipple component of the main current. While such reduction can be attained by use of larger energy storage elements, a large physical size to the energy storage elements may be undesirable in situations wherein laser printing equipment is to have a small physical size. Accordingly, in accordance with a further feature of the invention, there is provided a ripple current source responsive to the current sense signal for generating a ripple current which is substantially equal and opposite to that of the tipple component of the main current. The ripple current is summed with the main current at the input terminal of the bypass switch to essentially cancel the ripple component of the main current. This ensures a substantially constant amplitude to the main current.

As a further feature of the invention, it is desirable to increase the obtainable speed and frequency of operation of the bypass switch. This is accomplished by constructing the bypass switch as a set of parallel stages of emitter-coupled logic (ECL) wherein a first output terminal of each stage is connected to the laser, a second output terminal of each stage is connected to the bypass, and a common emitter terminal of each stage is connected to the input terminal of the bypass switch. A driver circuit responsive to the input digital data signal provides a pair of complementary output signals for driving the pair of differential input signals of each of the ECL stages. The parallel interconnection of the plural stages provides for a substantial reduction of the total inductance of the bypass switch, this allowing for an improved frequency response of the switch. The driver circuit has adequate power to overcome the total input capacitance of the plural ECL stages. Thereby, the bypass switch is operable to attain a high frequency pulsing of the laser current.

BRIEF DESCRIPTION OF THE DRAWINGS

The aforementioned aspects and other features of the invention are explained in the following description, taken in connection with the accompanying drawing wherein:

FIGS. 4 and 5 together constitute a schematic drawing of a main current source of the circuit of FIG. 1, wherein FIG. 4 shows a current switching regulator and a pulse-width modulator driving a transistor of the regulator, and FIG. 5 shows an amplifier with filter for loop compensation responsive to sensed current of the laser and the bypass for driving the pulse-width modulator of FIG.

DETAILED DESCRIPTION

Figure 1:
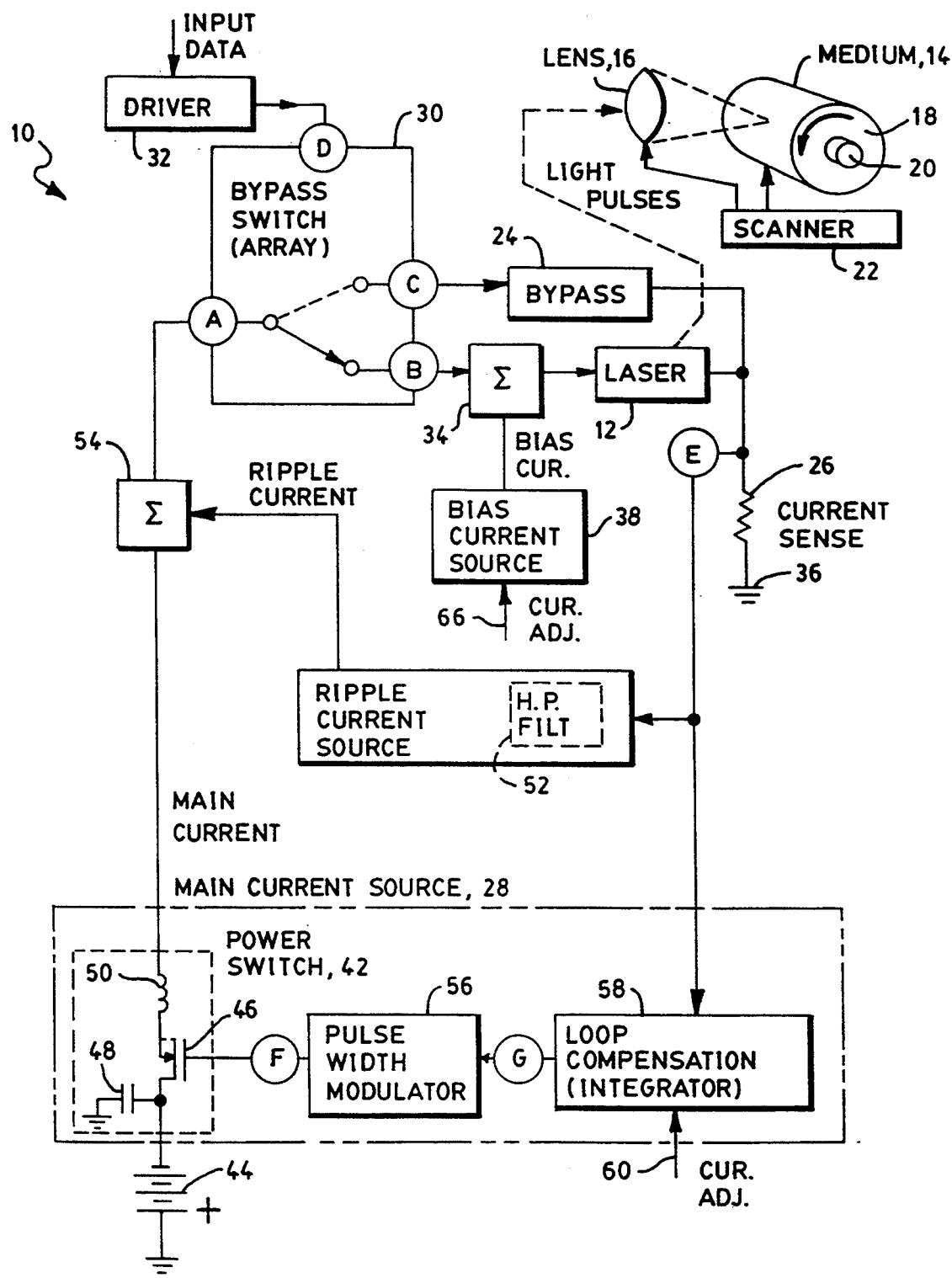
FIG. 1 is a simplified diagrammatic view of the driver circuit of the invention showing utilization of light outputted by a laser for printing an image on a photosensitive medium.

FIG. 1 shows a laser printer system 10 wherein a semiconductor laser 12 emits light for exposing a photosensitive recording medium 14 for imprinting an image thereon. An optical system, represented by a lens 16, focuses the light upon the medium 14. By way of example, the medium 14 may be carried along the outer surface of a drum 18 rotatable about an axle 20. Well-known scanning apparatus 22 positions the lens 16 to focus the laser beam in synchronism with rotation of the drum 18 to provide for a scanning of a beam of the laser light along the medium 14 to produce the image. The image is composed of a set of light and dark regions, or pixels, resulting from a sequence of pulses of the laser light. It is to be understood that the drum 18 represents one form of carrier of the medium 14 and that other forms of carrier, such as a planar film tray (not shown) may be used in carrying the medium 14 for producing the image. While FIG. 1 shows the use of the light pulses in the operation of a printing system to print an image, it is to be understood that, in accordance with the invention, the light pulses may be used also for purposes other than printing.

The circuitry of the invention comprises a bypass 24, a sensor of laser current such as a current-sensing resistor 26, a main current source 28 in the form of a power converter, and a bypass switch 30. Current from the main source 28 is applied to the laser 12 via the switch 30, the switch 30 being operative, in accordance with an important feature of the invention, to direct the main current alternately through the laser 12 and via a bypass path around the laser 12, the alternate bypass path being indicated in FIG. 1 as the bypass 24. Details in the construction of the bypass 24 and the switch 30 will be described hereinafter. To facilitate the description, it is convenient to identify various terminals of the circuitry. The main current enters the switch 30 via terminal A, and exits the switch 30 via either terminal B or terminal C. Terminal B provides for the direction of current through the laser 12, and terminal C provides for the direction of current through the bypass 24.

The switch 30 is operated via a driver 32 connected to terminal D of the switch 30, the driver 32 being responsive to an input digital data signal. In response to an input data signal having a logic-1 state, the driver 32 drives the switch 30 to apply the main current via the laser 12, and in response to an input data signal having a state of logic-0, the driver 32 drives the switch 30 to the alternate position for applying the main current to flow through the bypass 24. A first terminal of the laser 12 is connected via the summer 34 to terminal B of the switch 30, and a second terminal of the laser 12 is connected to terminal E of the current-sensing resistor 26. A first terminal of the bypass 24 connects with terminal C of the switch 30, and a second terminal of the bypass 24 connects also with terminal E of the resistor 26. Thereby, both the current of the laser 12 and the current of the bypass 24 pass through the current-sensing resistor 26. A voltage drop across the resistor 26, measured between terminal E and ground 36, serves as a measure of the current flowing through the laser 12 and of the current flowing through tile bypass 24.

The circuitry of FIG. 1 also includes a bias current source 38 and a ripple current source 40. The bias current source 38 applies bias current to the laser 12, the bias current being summed with the main current by the summer 34 for application of the sum of both main and bias currents to the laser 12. The main current source 28 includes a power switch 42 which is operative as a converter, in a manner to be described, by pulsing current from an external source of electrical power, shown as a battery 44, to convert the current and voltage of the battery 44 to a current of suitable value and a voltage of suitable value for operation of the laser 12. The power switch 42 includes a field-effect transistor (FET) 46 for switching current of the battery 44 to provide pulses of the current, and electrical-storage elements shown as a capacitor 48 and an inductor 50 for smoothing the train of current pulses to output a main current from the source 28 having a substantially constant amplitude. However, in view of the converter operation and the generation of pulses by the transistor 46, the main current has both a steady DC component plus a relatively small AC ripple component. In order to insure uniformity in the generation of the image of the medium 14, with respect to the difference between a light pixel and a dark pixel, it is desirable to minimize the ripple component of the main current. As will be described hereinafter, the ripple current source 40 includes a high-pass filter 52 for sensing the AC ripple component, tile ripple current source 40 generating a ripple current which is substantially equal and opposite to the ripple component of the main current so as to effectively cancel the ripple component of the main current. The cancellation is accomplished by summing the ripple current with the main current by a summer 54 prior to application of the main current to terminal A of the bypass switch 30. Thus, the current flowing in the laser 12 is the sum of the main current from the source 28, the ripple current from the source 40, and the bias current from the source 38.

The main current source 28 further comprises a pulse width modulator 56 and a loop compensation unit 58 which will be described in detail hereinafter. Briefly, the modulator 56 includes an oscillator for providing a pulse train wherein the duty cycle of pulses of the pulse train are varied in accordance with a control signal provided by the compensation unit 58. The control signal of the compensation unit 58 is coupled via terminal G to the modulator 56. The pulse train outputted by the modulator 56 is coupled via terminal F to a gate terminal of the transistor 46 wherein pulses of the modulator 56 place the transistor 46 alternately in states of conduction and nonconduction. The average value of the main current increases with increased duty cycle of the modulator 56 providing for increased intervals of conduction of the transistor 46, a corresponding decrease in average value of the main current occurring upon a decrease in the duty cycle provided by the modulator 56. The compensation unit 58 operates in response to the magnitude of the current sensing signal at terminal E so as to maintain an average value of the main current to a desired level designated at a manual current adjustment 60.

Figure 2:
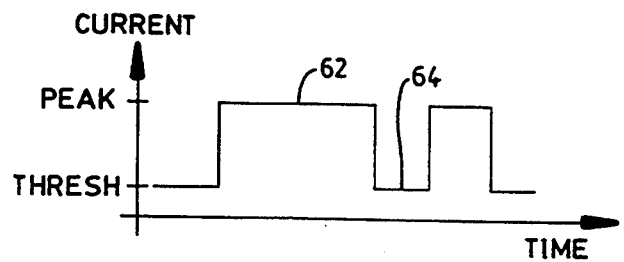
FIG. 2 is a timing diagram showing pulses of current applied to a laser in FIG. 1 for energizing the laser to emit pulses of light to expose a photosensitive recording medium of FIG. 1.

FIG. 2 shows a graph of current applied to the laser 12. The peak value of the current, at 62, is the same for all pulses of the current, and the minimum value of the current at 64, is the same for all interpulse intervals. The peak value is obtained with the bypass switch 30 coupling current between terminals A and B, as shown in FIG. 1, and the minimum value of current is obtained upon placing the bypass switch 30 in the alternate position for connecting current between terminals A and C for operation of the bypass 24. During application of the peak current to the laser 12, the sum of the currents of all three of the aforementioned sources 28, 40, and 38 is applied to the laser 12. However, during operation of the bypass 24, only the current of the bias current source 38 is applied to the laser 12. Adjustment of the bias current at the source 38 is provided by a manual current adjustment at 66. Thereby, as shown in FIG. 2, the laser current is modulated between two preset values of current. The minimum or bias current is set at a threshold value which biases the laser 12 to an operational state just below lasing threshold. The peak current is the current necessary to generate a desired optical power output by the laser 12.

The circuitry of the system 10 is operable to switch current to a semiconductor laser diode at various duty cycles with a maximum pulse repetition rate of 5 megahertz (MHz), and with a minimum pulse width of approximately 100 nanoseconds. Laser optical power output is to have a maximum value of approximately 1200 milliwatts, the laser threshold current provided by the bias source 38 is to be adjustable within a range of approximately 200 milliamperes (mA) to 500 mA, and the peak value of a current provided by the main source 28 is adjustable up to a maximum value of approximately 2.5 amperes.

As shown in FIG. 2, the pulses of the laser current, and accordingly of the optical pulses emitted by the laser, vary in their time duration. For example, if it is desired to produce a totally white or totally black line across the image of the medium 14, then a pulse of current applied to the laser 12 may be held continuously at the threshold value or at the peak value during the entire duration of a scan line across the medium 134. In contrast, during the generation of a portion of an image having line detail, the pulse repetition frequency may be at or near to the aforementioned maximum repetition rate of 5 MHz. The pulsing frequency of the pulse-width modulator 56 (FIG. 1) has a relatively high value, approximately 1 MHz so as to facilitate a filtering of the ripple component by the energy storage elements, namely the capacitor 48 and the inductor 50. The ripple current source 40 produces sufficient cancellation of the ripple component of the main current for image fidelity so that there is no need to provide any specific relationship between the operating frequency of the modulator 56 and an operating frequency of the scanning apparatus 22. Thus, the oscillation of the modulator 56 is allowed to proceed in a free-running manner independent of the operation of the scanning apparatus 22.

In accordance with yet another feature of the invention, the bypass switch is constructed of a plurality of emitter-logic (ECL) stages to facilitate handling of relatively large amounts of laser current and to increase the switching speed so as to accomplish the high pulse repetition rate for the switching current in the laser 12. The use of the parallel ECL stages decreases the total inductance of the switch 30 so as to allow for a higher rate of signal pulses outputted by the switch 30. The increased input capacitance presented to the driver 32 by the parallel connection of the plural switching stages is met by providing the driver 32 with sufficient power to overcome the additional capacitance, and thereby attain the high switching speed for the switch 30.

Figure 3:
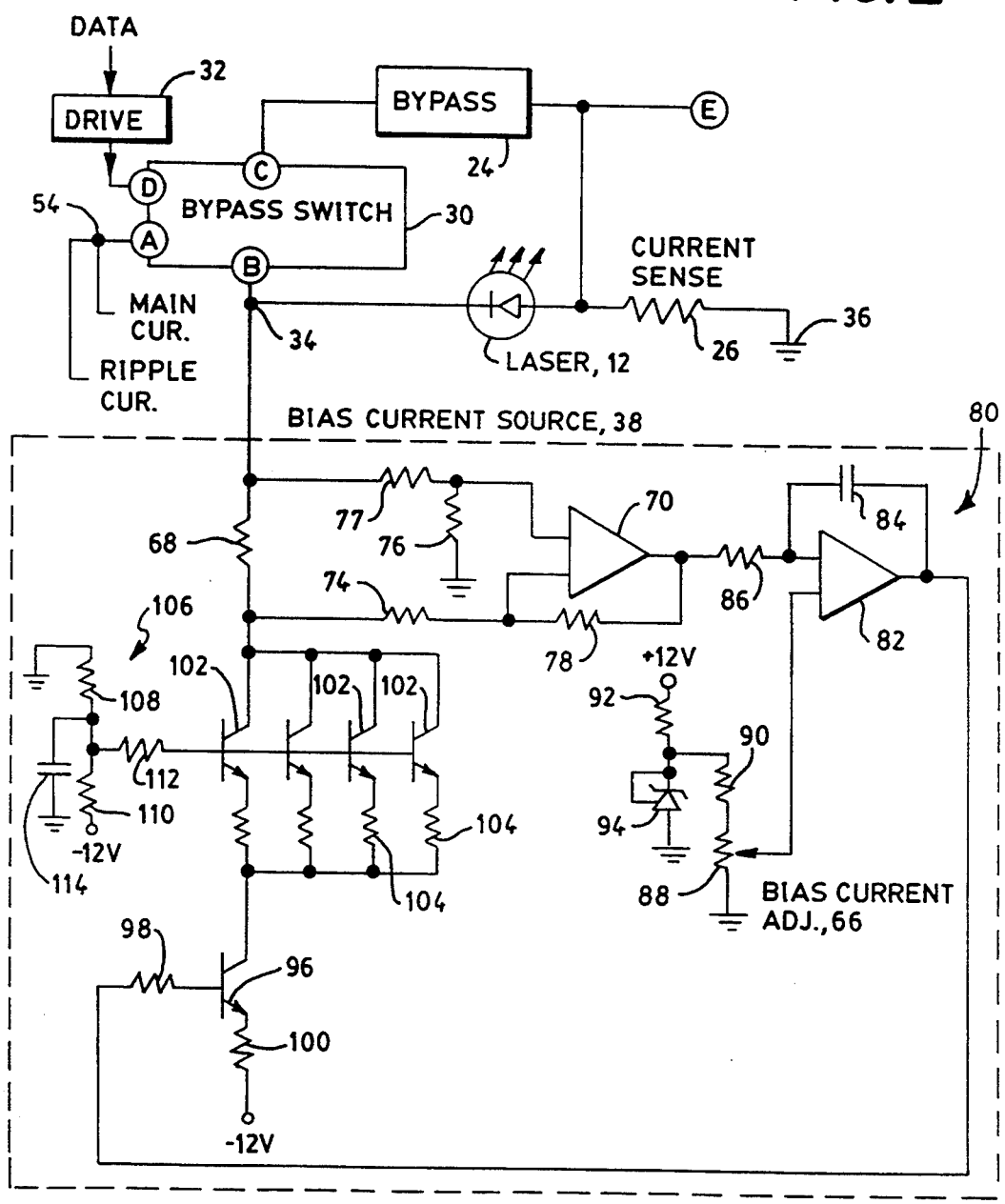
FIG. 3 is a schematic of a portion of the circuit of FIG. 1, namely a laser bias current source, and connection of the bias current source with other components of FIG. 1.

FIG. 3 shows details in the construction of the bias current source 38, and interconnection of the current source 38 with other components of the system 10 of FIG. 1. The function of the summer 34, namely the summing of the bias current with the main current, is accomplished by connection of the electrical conductors from terminal B and from the bias source 38 at a current-summing node, as indicated at 34 in FIG. 3. Similarly, the function of the summer 54, namely the summing of the ripple current with the main current, is accomplished by connecting the electrical conductors from the ripple current source 40 and the main current source 28 at a current-summing node, as indicated at 54 in FIG. 3.

The bias current source 38 comprises a current sensing resistor 68 and a differential amplifier 70 having a non-inverting input terminal connected by a resistor 72 to one terminal of the resistor 68, and an inverting input terminal connected via a resistor 74 to the second terminal of the resistor 68. A resistor 76 connects between the noninverting input terminal of the amplifier 70 and ground, and a resistor 78 is connected in a feedback path between the inverting input terminal and the output terminal of the amplifier 70. In the preferred embodiment of the invention, the current sensing resistor 26 has a value of 0.1 ohm, the resistor 68 has a value of 1 ohm, each of the resistors 72, 74, 76, and 78 have a value of 10 kilohm. The amplifier 70 has a voltage gain of unity so that the output terminal thereof provides a voltage equal to the voltage dropped across the resistor 68. Preferably, the resistors 26 and 68 are precision resistors so as to provide accurate measures of the total current flowing through the resistor 26, and the bias current flowing through the resistor 68 to the laser 12.

The bias current source 38 further comprises an integrator 80 having a differential amplifier 82 with a capacitor 84 connected between an inverting input terminal and an output terminal of the amplifier 82. The inverting input terminal of the amplifier 82 is connected via resistor 86 to the output terminal of the amplifier 70. The bias current adjustment 66 comprises a potentiometer 88 having a tap connected to the noninverting input terminal of the amplifier 82. One terminal of the potentiometer 88 is grounded, and the second terminal of the potentiometer 88 is connected serially via resistors 90 and 92 to a positive terminal of a voltage source, a 12 volt source being used in the preferred embodiment of the invention. Also, a semiconductor voltage reference element 94 is connected between ground and the junction of resistor 90 and resistor 92 to provide a stable voltage reference for the potentiometer 88. In the preferred embodiment of the invention, the resistor 86 has a value of 10 kilohm, the capacitor 84 has a value of 0.01 microfarad, the resistor 92 has a value of 1 kilohm, the resistor 90 has a value of 22 kilohm, and the potentiometer 88 has a resistance of 5 kilohm.

The bias current source 38 further comprises a transistor 96 which serves as a current source, and has a base terminal connected via a resistor 98 to an output terminal of the integrator 80. An emitter terminal of the transistor 96 is connected via a resistor 100 to the negative terminal of a voltage source, a 12 volt source being employed in the preferred embodiment of the invention. A set of four transistors 102 each of which has an external emitter resistor 104, are connected in parallel with their respective collector terminals being connected together and to the junction of the resistors 68 and 74, and wherein the base terminals of the transistors 102 are connected together. Each of the transistors 102 is connected via its emitter resistor 104 to the collector terminal of the transistor 96. A bias current supply 106 provides base current to the transistors 102, and comprises two resistors 108 and 110 connected serially between ground and a negative voltage terminal ($-12$ volts). The bias current supply 106 includes a resistor 112 connecting between a junction of the resistors 108 and 110 to feed current to the base terminals of the transistors 102, and a capacitor 114 connected between ground and the junction of the resistors 108 and 110.

The set of transistors 102 serves as an isolation unit for isolating the transistor 96 from any transient voltages resulting from the switching of current to the laser 12 and appearing at terminal B, thereby preventing such transient voltages from being coupled via capacitance of the transistor 96 throughout the bias current source 38. In addition, the set of transistors 102 serves to reduce the amount of voltage appearing across the transistor 96 by absorbing power of the bias current passing from the transistor 96 to the resistor 68. The power dissipated in the transistors 102 is regarded as a relatively small power loss because of the relatively small size of the bias current, as compared to the size of the main current. In the preferred embodiment of the invention, each of the transistors 102 is type 2N2222, and each of the resistors 104 has a value of 10 ohms. The transistor 96 is type 2SC3072, the resistor 98 has a value of 1 kilohm and the resistor 100 has a value of 6.8 kilohm. In the preferred embodiment of the invention, the resistor 108 has a value of 1 kilohm, the resistor 110 has a value of 2 kilohm, the resistor 112 has a value of 470 ohms, and the capacitor 114 has a value of 0.1 microfarad.

In the operation of the bias current source 38, the amplifier 70 in conjunction with the sense resistor 68 outputs a signal to the integrator 80 indicating the amplitude of the bias current. The signal is integrated by the integrator 80 and applied as an input signal to the transistor 96. The differential amplifier 82 of the integrator 80 drives the transistor 96 to produce a bias current which drives the overall loop of the bias source 38 to induce equality between the signals at the two input terminals of the differential amplifier 82. Thereby, the bias current flowing through the resistor 68 is made to be equal to the selected value of current at the bias current adjust 66.

Figure 4:
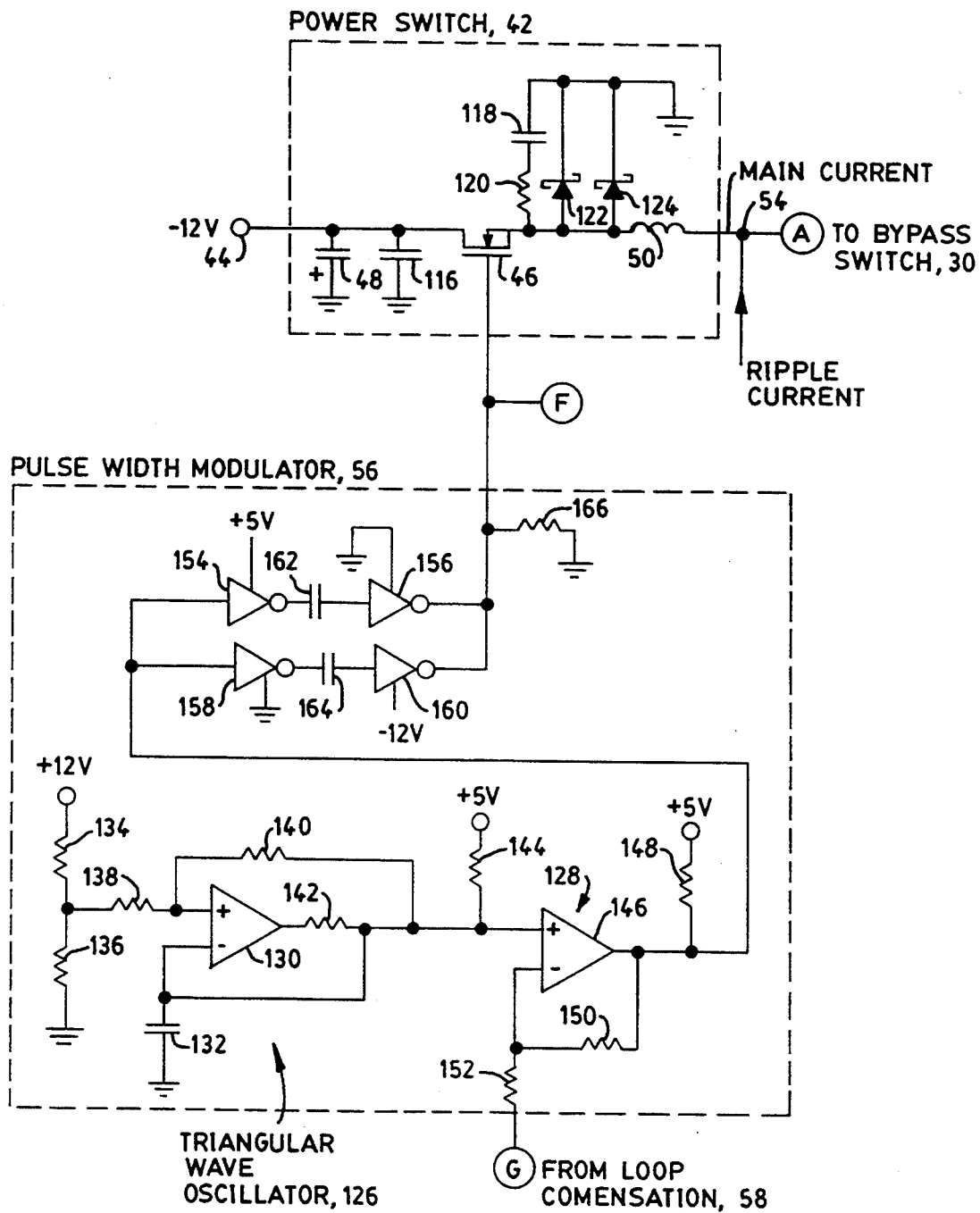

FIG. 4 shows details in the construction of the power switch 42 and the pulse-width modulator 56 of the main current source 28 of FIG. 1. In FIG. 4, the power switch 42 comprises additional capacitors 116 and 118, a resistor 120, and two Schottky diodes 122 and 124. The capacitor 116 is connected in parallel with the capacitor 48. The diodes 122 and 124 are connected in parallel, their anode terminals being connected to a junction of the transistor 46 and the inductor 50. The resistor 120 and the capacitor 118 are connected in series between ground and the junction of the transistor 46 with the inductor 50. In the preferred embodiment of the invention, the capacitor 48 has a capacitance of 22 microfarads and the capacitor 116 has a value of 0.1 microfarads for operation at both low and high frequencies of the current flowing between the negative terminal of the battery 44 and the switch terminal A. The diodes 122 and 124 provide for a current path allowing current in the inductor 50 to continue to flow after a termination of a state of conduction within the transistor 46. The resistor 120 and the capacitor 118 serve as a filter for smoothing the switching transients in the switching of the main current. The capacitors 48 and 116 serve as both a source and a sink of current for smoothing switching transients as the transistor 46 passes between successive stages of conduction and nonconduction. Upon a termination of a state of conduction of the transistor 46, energy stored within the magnetic field of the inductor 50 provides for a continuation of the flow of current to terminal A of the bypass switch 30. In the preferred embodiment of the invention, the Schottky diodes 122 and 124 are type 6CWQ03F, specified for a maximum DC current of 6.6 amperes and a maximum reverse voltage of 30 volts, and the transistor 46 is a N-channel MOSFET type IRFR014. The inductor 50 has a value of 47 microhenries.

Figure 5:
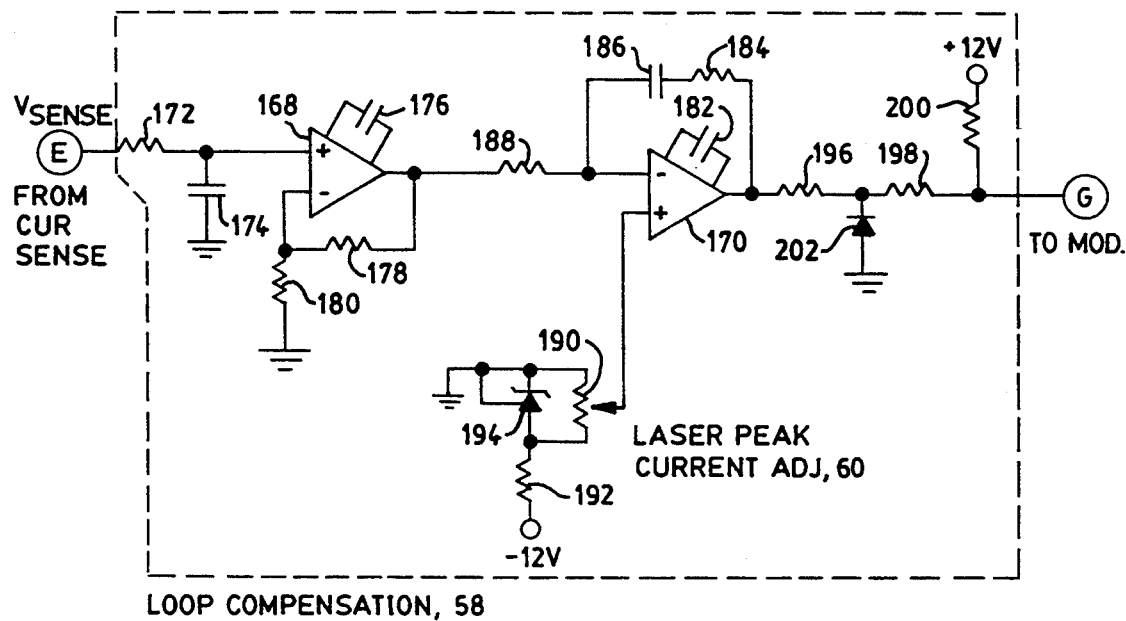

The modulator 56 includes a triangular wave oscillator 126 and a comparator 128. The oscillator 126 includes a differential amplifier 130, a capacitor 132, and five resistors 134, 136, 138, 140, and 142. The resistors 134 and 136 are connected in series between a positive voltage (such as 12 volts) and ground. A junction of the two resistors 134 and 136 is connected by the resistor 138 to a noninverting input terminal of the amplifier 130. The resistor 142 is connected at a first terminal thereof to the output terminal of the amplifier 130, a second terminal of the resistor 142 being connected to the inverting input terminal of the amplifier 130. The resistor 140 is connected between the noninverting input terminal of the amplifier 130 to the second terminal of the resistor 142. A further resistor 144 connects a source of positive voltage (such as 5 volts) to the junction of the resistors 140 and 142. The comparator 128 comprises a differential amplifier 146 and three resistors 148, 150, and 152. The inverting input terminal of the differential amplifier 146 connects with the junction of the resistors 140, 142, and 144. The resistor 150 connects between an output terminal of the amplifier 146 and the noninverting input terminal of the amplifier 146. The resistor 148 connects between a source of positive voltage (such as 5 volts) and the output terminal of the amplifier 146. The resistor 152 connects between the noninverting input terminal of the amplifier 146 and terminal G for connection to an output terminal of the loop compensation unit (FIGS. 1 and 5).

With reference to FIG. 4, and in reference to the operation of the oscillator 126, the resistors 140 and 142 provide positive feedback and the resistor 142 provides negative feedback. The amplifier 130 provides current which serves to charge the capacitor 132 during a portion of each cycle and to discharge the capacitor 132 during the balance of each cycle of the oscillation waveform. The resistors 134, 136, and 138 provide an input operating point to the amplifier 130. In addition, these resistors in combination with the resistor 140 serve to provide a gain factor for the amplifier 130. The resistor 144, in view of its connection between the capacitor 132 and the source of positive voltage, aids in the charging of the capacitor 132. With respect to the operation of the comparator 128, the resistor 150 serves as a feedback resistor for establishing gain of the comparator. A signal from the loop compensation unit 58 at terminal G is applied via the resistor 152 to the amplifier 146, and a signal of the oscillator 126 is coupled via the resistor 152 to the amplifier 146. The two signals are compared at the two input terminals of the amplifier 146 to provide an output signal having either a high or a low value depending on the relative magnitudes of the two input signals to the amplifier 146.

A set of four output driver units 154, 156, 158 and 160 couple the output terminal of the comparator 128 via terminal F to the power switch 42. The resistor 148 serves to provide an output load to the comparator 128 as well as an input bias to the driver units 154 and 158. The driver units 156 and 160 are gate drivers having sufficient power to drive input capacitance of the transistor 146 so as to accomplish the 1 MHz pulse repetition switching rate of the transistor 46. The driver units 154 and 158 may be buffer amplifiers. The driver units 154 and 156 are coupled via a capacitor 162, and the driver units 158 and 160 are coupled via a capacitor 164. A resistor 166 is connected between terminal F and ground to provide an operating point to the gate terminal of the transistor 46 as well as to establish a load for the driver units 156 and 160. The series parallel arrangement of the driver units 154–160 provides for the application of power to the output signal of the comparator 128 during both positive and negative swings of the output signal of the comparator 128.

In the preferred embodiment of the invention, the resistors 134, 138, 140 and 150 each have a value of 100 kilohm. The resistor 136 has a value of 39 kilohm, the resistor 142 has a value of 680 ohms, and the capacitor 132 has a capacitance of 1000 picofarads. Each of the resistors 144, 148, and 152 have a value of 1 kilohm. Each of the capacitors 162 and 164 have a value of 0.1 microfarad. The driver units 154 and 158 are buffer amplifiers, type 74F14, and the driver units 156 and 160 are gate drivers, type DS0026. The resistor 166 has a value of 100 kilohm.

FIG. 5 shows circuitry of the loop compensation unit 58. The compensation unit 58 comprises two differential amplifiers 168 and 170, and an input low-pass filter comprising a resistor 172 connected between a noninverting input of the amplifier 168 and terminal E and a capacitor 174 connected between ground and the junction of the resistor 172 with the amplifier 168. The amplifier 168 includes an externally connected capacitor 176 for controlling stability and bandwidth of the amplifier 168, a resistor 178 connected in a feedback path between an output terminal of the amplifier 168 and an inverting input terminal of the amplifier 168, and a resistor 180 connecting between ground and the inverting input terminal of the amplifier 168. The amplifier 170 includes an externally connected capacitor 182 for controlling stability and bandwidth of the amplifier 170, and a feedback path comprising a resistor 184 serially connected with a capacitor 186 between an output terminal of the amplifier 170 and an inverting input terminal of the amplifier 170. A resistor 188 interconnects an output terminal of the amplifier 168 with the inverting input terminal of the amplifier 170.

A voltage reference circuit of the laser peak current adjustment 60 includes a potentiometer 190 with a tap connected to the noninverting input terminal of the amplifier 170. One terminal of the potentiometer 190 is grounded and the other terminal is connected via a resistor 192 to a source of negative voltage (such as −12 volts). A voltage reference element 194 is connected across the terminals of the potentiometer 190 to establish a precise value of voltage to serve as a reference for the peak current adjustment 60. A diode clamp circuit interconnects an output terminal of the amplifier 170 with terminal G, the clamp circuit comprising three resistors 196, 198, and 200, and a diode 202. The resistors 196 and 198 are connected serially between terminal G and the output terminal of the amplifier 170, with the diode 202 being connected between ground and a junction of the resistors 196 and 198. The resistor 202 is connected between terminal G and a positive source of voltage (such as 12 volts).

In operation, the current sense signal at terminal E is applied to the low-pass filter of the resistor 172 and the capacitor 174 to form an average value of the current in the sense resistor 26 (shown in FIG. 1), the average value being applied to the amplifier 168. It is noted that the value of the current in the resistor 26 of FIG. 1 is essentially constant because the bias current from the bias source 38 flows steadily through the laser 12 into the resistor 26, and the sum of the main and the ripple currents flows steadily either via the laser 12 or via the bypass 24 into the resistor 26. Thus, except for possible differences in resistance of the electrical paths through the laser 12 and the bypass 24, and with the exception of possible switching transients, the sense voltage at terminal E is constant, and the low-pass filter of the resistor 172 and the capacitor 174 serves to smooth out the foregoing perturbations. The filtered signal is amplified by the amplifier 168, and applied to the amplifier 170 which performs an integration function. The integration is accomplished by the feedback loop comprising the resistor 184 and the capacitor 186. In addition, the amplifier 170 forms the difference between the desired current as set by the current adjustment 60, and the actual current measurement, as inputted via resistor 188 to the amplifier 170. The compensation unit 58 outputs a signal to terminal G to provide a magnitude of main current which minimizes the difference between the current commanded at the current adjustment 60 and the current as measured from terminal E.

In the construction of the preferred embodiment of the invention, the resistor 172 has a value of 270 ohms, and the capacitor 174 has a value of 330 picofarads. The capacitor 176 has a value of 3 picofarads, the resistor 178 has a value of 2.7 kilohms, and the resistor 180 has a value of 300 ohms. The resistor 188 has a value of 680 ohms, and the resistors 184 and 198 each have a value of 4.7 kilohm. The resistors 192 and 196 each have a value of 2.2 kilohms. The capacitor 186 has a value of 0.01 microfarads, and the capacitor 182 has a value of 3 picofarads. The potentiometer 190 has a value of 10 kilohms, and the resistor 200 has a value of 100 kilohm.

Figure 6:
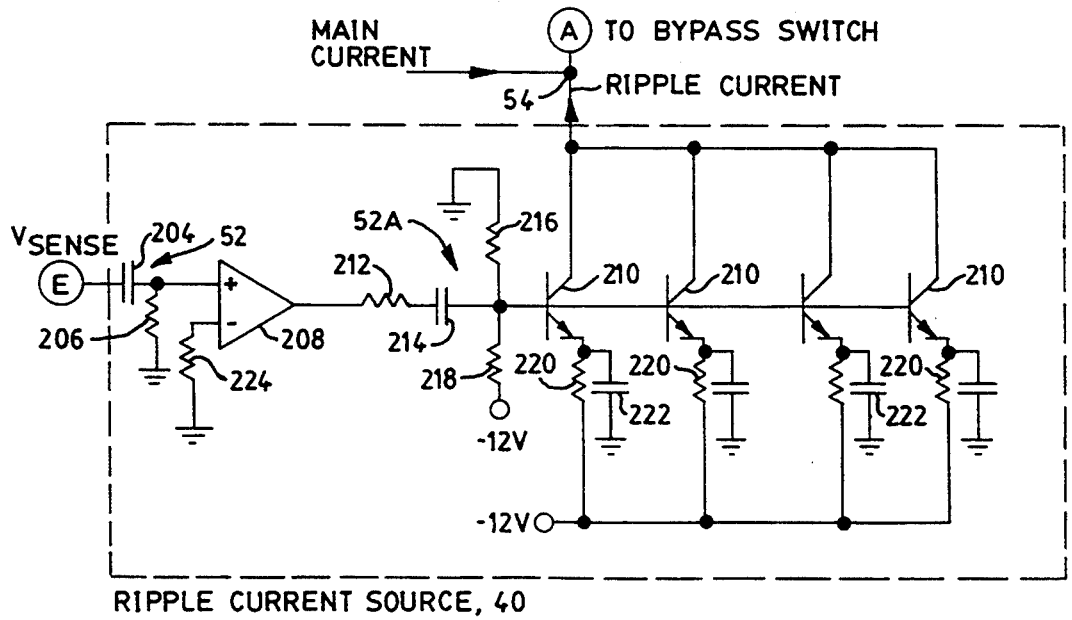
FIG. 6 is a schematic diagram of a ripple reduction current source for canceling ripple in output current of the main current source of FIG. 4.

FIG. 6 shows details in the construction of the ripple current source 40. In the ripple source 40, the high-pass filter 52 comprises a capacitor 204 and a resistor 206. The capacitor 204 connects the noninverting input terminal of the amplifier 208 to terminal E, and the resistor 206 grounds the noninverting input terminal. The ripple source 40 further comprises a differential amplifier 208 and a set of four transistors 210 having their collector terminal connected together and to the terminal A, and having their base terminals connected together. The base terminals of the transistors 210 are driven by an output signal of the amplifier 208 via a high-pass filter 52A. The filter 52A comprises a resistor 212 and a capacitor 214 serially connected between the output terminal of the amplifier 208 and the base terminals of the transistors 210. The filter 52A further comprises two resistors 216 and 218 serially connected between ground and a negative source of voltage (such as −12 volts), wherein a junction of the resistors 216 and 218 connects with a junction of the capacitor 214 and the base terminals of the transistors 210. Each of the transistors 210 is coupled via a resistor 220 to a source of negative voltage (such as −12 volts), and by a capacitor 222 to ground. The serial connection of the resistors 216 and 218 serves to provide bias base current to the transistors 210. An inverting input terminal of the amplifier 208 is connected by a resistor 224 to ground.

In the operation of the ripple current source 40, the voltage sense signal at terminal E, representing the current flowing through the resistor 26, is filtered by the high-pass filter 52 preceding the amplifier 208, and via the high-pass filter 52A following the amplifier 208. This filtering of the signal at terminal E extracts any AC ripple component which may be present, and applies the signal to activate the transistors 210 to draw a current via terminal A. The current has a sense opposite to that of the detected ripple, and a magnitude equal to that of the detected ripple. Thereby, the current produced by the transistors 210 is a ripple current equal and opposite to that sensed at terminal E, and which is suitable for cancellation of the ripple component of the main current by summation with the main current at the summer 54. The resistors 220 serve to provide quiescent bias currents in the respective transistors 210, and the capacitors 222 serve to provide bypass paths past the resistors 220 for the AC current. In the construction of the preferred embodiment of the invention, each of the capacitors 204, 214, and 222 has a value of 0.1 microfarads. The resistors 206, 224, and 218 each have a value of 1 kilohm, and the resistor 216 has a value of 3.3 kilohm. The resistor 206, 212 has a value of 47 ohms, and each of the resistors 220 has a value of 33 ohms. Each of the transistors 210 is type 2N2222.

Figure 7:
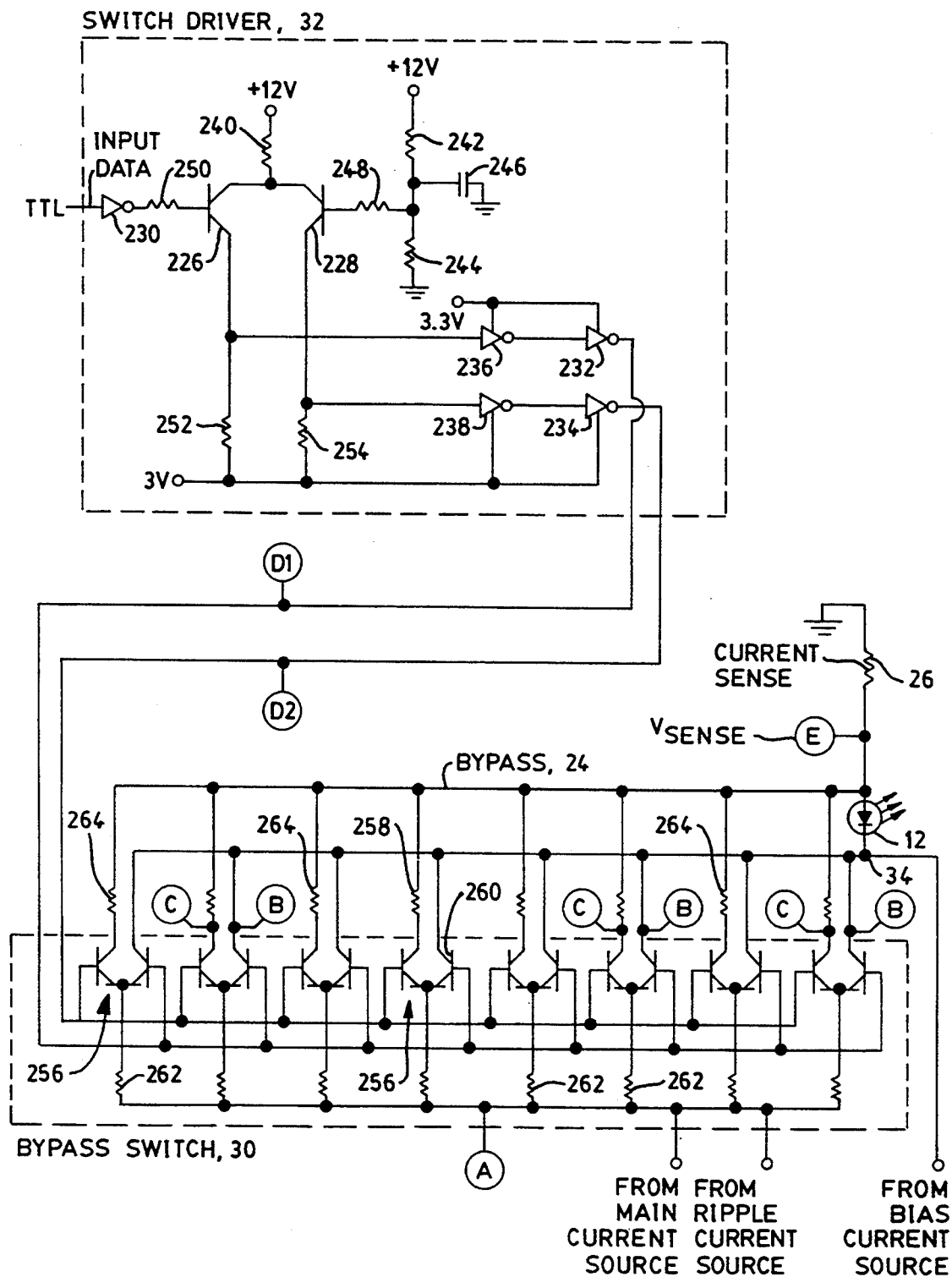
FIG. 7 is a schematic diagram of an array of parallel stages of emitter-coupled logic stages employed in construction of a bypass switch of FIG. 1, and a driver circuit responsive to an input data signal for driving the switch.

FIG. 7 shows details in the construction of the bypass switch 30 and its driver 32, including interconnections of the units with other units of the circuit of the system 10 of FIG. 1. The switch driver 32 comprises two PNP transistors 226 and 228, an input buffer amplifier 230, two gate drivers 232 and 234 having sufficient power to drive the capacitance of an array of transistors, and two buffer amplifiers 236 and 238 which drive the drivers 232 and 234, respectively. In the preferred embodiment of the invention, the transistors 226 and 228 are type 2N3906, and are connected in an emitter-coupled configuration via a common emitter resistor 240 connecting with a positive supply of voltage (such as 12 volts). A bias reference current is provided by two resistors 242 and 244 connected serially between the source of positive voltage (such as 12 volts) and ground. A junction of the two resistors 242 and 244 is grounded incrementally via a capacitor 246, and connects via a resistor 248 to the base terminal of the transistor 228. An output terminal of the amplifier 230 connects via a resistor 250 to the base terminal of the transistor 226. Collector terminals of the transistors 226 and 228 are connected via resistors 252 and 254, respectively, to a source of negative voltage (such as −8.3 volts), thereby to provide the function of a voltage level shift suitable for driving the amplifiers 236 and 238. The collector terminals of the transistors 226 and 228 are further connected to input terminals of the amplifiers 236 and 238, respectively. In the preferred embodiment of the invention, the amplifiers 230, 236, and 238 are type 74F14, and the gate drivers 232 and 234 are type DS0056.

In the operation of the switch driver 32, the input data, which is in the form of a TTL (transistor transistor logic) digital signal is applied via the input buffer amplifier 230 to drive the transistor 226. Due to the differential configuration of the circuitry of the two transistors 226 and 228, an increase of current in the transistor 226 in response to the input data signal is accompanied by a decrease in current in the transistor 228. This produces a pair of oppositely phased output voltages generated across the resistors 252 and 254 for application to the amplifiers 236 and 238, respectively. The gate drivers 232 and 234 thereby output a pair of opposed or complementary drive signals wherein the gate driver 232 outputs a signal at terminal D1 having a waveform equal to that of the input data, and the gate driver 234 outputs a signal at terminal D2 having a waveform complementary to that of the input data signal. It is noted that in the simplified view of FIG. 1, the connection of the driver 32 to the bypass switch 30 is indicated by a single terminal identified as terminal D. In the detailed schematic of FIG. 7, the two terminals D1 and D2 correspond to the single terminal D of FIG. 1. In the preferred embodiment of the invention, each of the resistors 248 and 250 have values of 100 ohms, and each of the resistors 252 and 254 have values of 220 ohms. Each of the resistors 240 and 244 have values of 1 kilohm. The resistor 242 has a value of 4.7 kilohms, and the capacitor 246 has a value of 0.01 microfarad.

The bypass switch 30 comprises eight stages 256 of transistors wherein each of the stages 256 comprises two transistors 258 and 260 connected together in an emitter-coupled configuration (ECL) sharing a common emitter resistor 262 connecting with terminal A. In each of the stages 256, the base terminal of the transistor 258 connects with terminal D2, and the base terminal of transistor 260 connects with the terminal D1. Thereby, all of the transistors 258 are driven in parallel via terminal D2 by the driver 234, and all of the transistors 260 are driven in parallel via the terminal D1 by the driver 232. In each of the stages 256, the collector terminal of the transistor 258 connects with terminal C and is further connected via a resistor 264 to terminal E. In each of the stages 256 the collector terminal of the transistor 260 connects via terminal B and the summer 34 to the laser 12. Also, as shown in FIG. 7, the semiconductor laser 12 is in the form of a diode having its cathode connected to the summer 34, and having its anode connected to terminal E.

Upon comparing FIGS. 1 and 7, it is noted that the single bypass 24 of FIG. 1 is accomplished by use of the eight parallel stages in FIG. 7 wherein there are provided eight separate ones of the resistors 264 for the bypass 24. The combined resistance of the resistors 264, taken in parallel, is approximately equal to that of the diode of the laser 12 during conduction of laser current in the forward direction of the diode. As has been noted hereinabove, the use of the eight stages in parallel reduces the inductance presented by the bypass switch 30 to the gate drivers 232 and 234 enabling the switch driver 32 to switch the laser current at the desired high rate. Also, as has been noted hereinabove, the use of eight transistors in parallel greatly increases the capacitive loading to the switch driver 32. However, the gate drivers 232 and 234 have been selected because of their ability to handle the additional capacitance and provide for the desired high-switching rate of the bypass switch 30. In the preferred embodiment of the invention, each of the transistors 258 and 260 is type 2N2222. Each of the resistors 262 has a value of 2.2 ohms. Each of the resistors 264 has a value of 9.1 ohms.

In response to a logic-1 signal applied in the input data to the amplifier 230, the transistor 260 in each of the stages 256 is placed in a state of conduction and the transistor 258 in each of the stages 256 is placed in a state of nonconduction. Therefore current is drawn through the laser 12 activating the laser to emit light, and no current is drawn through the bypass 24. In view of the polarity of the battery 44 (shown in FIG. 1), the positive direction of current flow through the laser 12 is from ground through the sense resistor 26 to the laser 12, and then continuing through the transistors 260 and the emitter resistors 262 in each of the stages 256, and then via terminal A through the power switch 42 (shown in FIGS. 1 and 4) to the battery 44. In the presence of a logic-0 signal in the input data to the amplifier 230, the states of conduction of the transistors 260 and 258 in each of the stages 256 are interchanged with the result that the current of terminal A now flows from the sense resistor 26 through the resistors 264 of the bypass 24 instead of flowing through the laser 12. Thereby, each of the stages 256 acts as a switch for directing current from the sense resistor to the terminal A via either the laser 12 or the bypass 24.

By way of alternative embodiments of the invention, it is noted that, if desired, the resistors 264 in each of the stages 256 could be replaced by a single additional laser having substantially matched characteristics to the laser 12 to provide impedance loading for the bypass equal to the impedance loading provided by the laser 12. The optical output of the additional laser would simply be absorbed and the resultant heat dissipated. It is noted also that, by way of alternative embodiments of the invention, that the current levels outputted by the gate drivers 232 and 234 can be reduced so as to place transistors 258 and 260 in each of the stages 256 in states of only partial conduction and partial nonconduction in which case the light of the laser 12 would not be fully extinguished between pulses of the light. While such a utilization of the bypass switch 30 may be detrimental in the operation of a laser printer, it is noted that the circuitry of the invention has use in areas outside of the laser printing field, in which case such partial switching of current through a laser diode or other load may be useful.

In view of the foregoing circuitry, it is apparent that the components of the laser printer system are able to switch the laser current at a high rate by use of the bypass, this arrangement permitting the main current and the bias current to be maintained at a constant value. This also increases the efficiency of the circuitry over that which has been available heretofore, this benefit being attained by virtue of the use of the bypass and the bypass switch to maintain the constant flow of the main current.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A laser current drive circuit comprising;
   a laser having a first terminal and a second terminal, and a current bypass having a first terminal and a second terminal;
   a current sensor having a terminal connecting to the second terminal of said laser and to the second terminal of said bypass to provide a signal indicating the amplitude of current flowing through said laser and said bypass;
   a main source of current for energizing said laser to emit light, said main current source further comprising feedback means responsive to the signal of said current sensor to output a main current at a desired amplitude;
   a bypass switch connecting an output terminal of said regulator to the first terminal of said laser and to the first terminal of said bypass; and
   drive means responsive to pulses of an input data signal for operating said bypass switch to direct the main current alternately to said laser and to said bypass, pulsations of said data signal resulting in pulsations of the main current to said laser with corresponding emission of light pulses from said laser.

2. A circuit according to claim 1 further comprising a bias current source connected to the first terminal of said laser for applying a bias current to said laser in addition to said main current, wherein said laser is a semiconductor laser, and said bias current has an amplitude below a lasing threshold amplitude of the semiconductor laser.

3. A circuit according to claim 2 wherein said main source of current includes a current switching regulator operative by said feedback means to output the main current.

4. A circuit according to claim 3 wherein the main current outputted by said regulator has a DC component and a ripple component, said circuit further comprising a ripple current source responsive to the signal of said current sensor for generating a ripple current substantially equal and opposite to said ripple component, said ripple current source being connected to an input terminal of said bypass switch for summing the ripple current with said main current to cancel the ripple component.

5. A circuit according to claim 4 wherein the said current sensor is a resistor.

6. A circuit according to claim 4 wherein said ripple current source includes a high-pass filter connected to the terminal of said current sensor for receiving a ripple component of the sensor signal while excluding a DC component of the sensor signal.

7. A circuit according to claim 2 wherein said bias current source includes a current sensing resistor to develop a feedback signal, and a transistor current source responsive to the feedback signal for providing a desired magnitude of bias current.

8. A circuit according to claim 1 wherein said main source of current includes a current switching regulator operative by said feedback means to output the main current and wherein, in said main source of current, said feedback means includes a pulse-width modulator for driving said regulator.

9. A circuit according to claim 8 wherein, in said main source of current, said regulator has a transistor connected as a gate on an electrical conductor from an external source of electrical power, said transistor being placed alternately in states of conduction and nonconduction by said pulse-width modulator.

10. A circuit according to claim 9 wherein said main source of current further comprises electrical-energy storage elements including an inductor and a capacitor connected to terminals of said transistor of said regulator for converting pulsations of current in said transistor of said regulator to a substantially steady flow of current.

11. A circuit according to claim 1 wherein said bypass switch comprises a plurality of emitter-coupled logic (ECL) stages, said ECL stages being connected in parallel to reduce inductance and provide an increased speed of operation, each of the ECL stages having one output terminal connected to said laser and a second output terminal connected to said bypass and a common emitter terminal connected via an input terminal of the bypass switch to said main source of current.

12. A circuit according to claim 11 further comprising a bias current source connected to the first terminal of said laser for applying a bias current to said laser in addition to said main current, wherein said laser is a semiconductor laser, and said bias current has an amplitude below a lasing threshold amplitude of the semiconductor laser;
   wherein said main source of current includes a current switching regulator operative by said feedback means to output the main current; and
   wherein the main current outputted by said regulator has a DC component and a ripple component, said circuit further comprising a ripple current source responsive to the signal of said current sensor for generating a ripple current substantially equal and opposite to said ripple component, said ripple current source being connected to the input terminal of said bypass switch for summing the ripple current with said main current to cancel the ripple component.

13. A circuit according to claim 11 wherein said main source of current includes a current switching regulator operative by said feedback means to output the main current;
   wherein the main current outputted by said regulator has a DC component and a ripple component, said circuit further comprising a ripple current source responsive to the signal of said current sensor for generating a ripple current substantially equal and opposite to said ripple component, said ripple current source being connected to the input terminal of said bypass switch for summing the ripple current with said main current to cancel the ripple component;

wherein said ripple current source includes a high-pass filter connected to the terminal of said current sensor for receiving a ripple component of the sensor signal while excluding a DC component of the sensor signal; and wherein in said main source of current, said feedback means includes a pulse-width modulator for driving said regulator.

14. A laser current drive circuit comprising;
a semiconductor laser having a first terminal and a second terminal, and a current bypass having a first terminal and a second terminal;
a current sensor having a terminal connecting to the second terminal of said laser and to the second terminal of said bypass to provide a signal indicating the amplitude of current flowing through said laser and through said bypass;
a main source of current, including a current switching regulator, for energizing said laser to emit light, said main current source further comprising feedback means responsive to the signal of said current sensor for operating said regulator to output a main current at a desired amplitude;
a bypass switch connecting an output terminal of said regulator to the first terminal of said laser and to the first terminal of said bypass alternately in response to pulses of an input data signal to direct the main current alternately to said laser and to said bypass, pulsations of said data signal resulting in pulsations of the main current to said laser with corresponding emission of light pulses from said laser; and
wherein the bypass has an electrical resistance approximating an electrical resistance of said laser to maintain a substantially constant power dissipation of said main current independent of a position of said bypass switch.

15. A current drive circuit comprising;
a semiconductor device having a first terminal and a second terminal, and a current bypass having a first terminal and a second terminal;
a current sensor having a terminal connecting to the second terminal of said device and to the second terminal of said bypass to provide a signal indicating amplitude of current flowing through said device and through said bypass;
a main source of current, including a current switching regulator, for energizing said device to emit light, said main current source further comprising feedback means responsive to the signal of said current sensor for operating said regulator to output a main current at a desired amplitude;
a bypass switch connecting an output terminal of said regulator to the first terminal of said device and to the first terminal of said bypass alternately in response to pulses of an input data signal to direct the main current alternately to said device and to said bypass, pulsations of said data signal resulting in pulsations of the main current to said device with corresponding emission of light pulses from said device; and
a bias current source connected to the first terminal of said device for applying a bias current to said device in addition to said main current, wherein said bias current source is connected between said bypass switch and said device to maintain a substantially constant amplitude of said bias current independent of a position of said bypass switch.

16. A current drive circuit comprising;
a semiconductor device having a first terminal and a second terminal;
a current sensor having a terminal connecting to the second terminal of said device to provide a signal indicating amplitude of current flowing through said device and through said bypass;
a main source of current, including a current switching regulator, for energizing said device to emit light, said main current source further comprising feedback means responsive to the signal of said current sensor for operating said regulator to output a main current at a desired amplitude;
a bypass switch connecting an output terminal of said regulator to the first terminal of said device for alternately directing the main current to said device and diverting the main current from said device in accordance with an input data signal, pulsations of said data signal resulting in pulsations of the main current to said device with corresponding emission of light pulses from said device; and
a bias current source connected to the first terminal of said device for applying a bias current to said device in addition to said main current, wherein said bias current source is connected between said bypass switch and said device to maintain a substantially constant amplitude of said bias current independent of a position of said bypass switch.

17. A method of applying current to a laser comprising steps of:
providing a current bypass around the laser;
selectively switching a main current from a source of the main current alternately between said laser and said bypass to provide pulses of the main current of said laser;
monitoring a flow of current in said laser and in said bypass to provide a measure of current; and
controlling a magnitude of said main current in response to said current measure.

18. A method according to claim 17 further comprising steps of feeding a bias current to said laser, and holding the magnitude of the bias current constant during a pulsation of the main current in said laser.

19. A method according to claim 18 further comprising steps of: providing said main current source; providing a pulse-width modulation control of the main current in said main current source; and wherein said controlling step is accomplished by altering a duty cycle of said modulation.

20. A method according to claim 19 further comprising steps of: sensing a ripple component of the main current due to said modulation; producing a ripple current; and summing the ripple current with the main current to cancel said ripple component.

* * * * *